United States Patent [19]

Pschunder et al.

[11] 4,336,648
[45] Jun. 29, 1982

[54] METHOD OF CONTACTING A SOLAR CELL

[75] Inventors: Willi Pschunder, Ilsfeld; Gerhard Steinmetz, Bretzfeld-Dimbach, both of Fed. Rep. of Germany

[73] Assignee: Licentia Patent-Verwaltungs-G.m.b.H., Frankfurt am Main, Fed. Rep. of Germany

[21] Appl. No.: 202,731

[22] Filed: Oct. 31, 1980

[30] Foreign Application Priority Data

Nov. 2, 1979 [DE] Fed. Rep. of Germany ....... 2944185

[51] Int. Cl.³ ............................................ H01L 31/18
[52] U.S. Cl. ........................................ 29/572; 29/589; 136/244; 136/256
[58] Field of Search ................. 136/244, 256; 29/572, 29/589

[56] References Cited

U.S. PATENT DOCUMENTS

| 3,094,439 | 6/1963 | Mann et al. | 136/244 |
| 3,330,700 | 7/1967 | Golub et al. | 136/244 |
| 3,928,073 | 12/1975 | Besson et al. | 136/256 |
| 3,943,003 | 3/1976 | Dendall | 136/256 |
| 3,989,541 | 11/1976 | Brandhorst, Jr. | 136/256 |
| 4,055,442 | 10/1977 | Crosher | 136/256 |
| 4,086,102 | 4/1978 | King | 136/256 |

Primary Examiner—Aaron Weisstuch
Attorney, Agent, or Firm—Spencer & Kaye

[57] ABSTRACT

A solar cell comprises a semiconductor body with a p-n-junction, a metallized area on the light receiving surface of the semiconductor body, a connection or contact area on the light receiving surface, a reflection reducing layer completely covering the metallized area and the connection or contact area and a further contact on the rear face. A metal connector is fixed to the connection or contact area by placing the connector against the reflection reducing layer and conductively connecting the connector to the connection area while concurrently eliminating the reflection reducing layer from that area.

11 Claims, 4 Drawing Figures

METHOD OF CONTACTING A SOLAR CELL

BACKGROUND OF THE INVENTION

The invention relates to a solar cell comprising a semiconductor body containing a pn-junction, a metallized area on the upper surface provided for incoming light, which surface is provided moreover with a reflection reducing layer, and comprising a rear face contact on the opposite outer surface of the semiconductor body.

In the past, in order to increase the efficiency of conversion, silicon solar cells have been provided with an anti-reflection layer on the upper surface provided for incoming light. This reflection-reducing layer comprises an insulating material and therefore may not be allowed to cover the contact or region of connection on the front face of the solar cell which is provided for further connection to other cells. The thickness of the reflection-reducing layer must be selected so that the minimum of reflection occurs at approximately 600 nm. Generally, it is a λ/4 layer of an oxide having a refractive index of 1.4 to 2.4. This layer reduces the reflection capacity of the solar cell surface in a wavelength range between 0.3 and 1.2 μm from approximately 30% to less than 10% so that the degree of efficiency of the solar cells is considerably increased.

When manufacturing the reflection-reducing layer in the past, the contacting region had to be masked in order to prevent an insulating convering layer from being formed. This masking had to be removed again eventually in order to expose the metal contact.

SUMMARY OF THE INVENTION

It is an object of the invention to provide a solar cell which may be manufactured more simply by saving at least one masking step. Moreover, the solar cell should facilitate the very simple construction of batteries of solar cells.

According to a first aspect of the invention, there is provided a solar cell comprising a semiconductor body, a p-n-junction in said semiconductor body, a metallized area on the surface of said semiconductor body for incoming light, a connection or contact area for connection to other cells, on said surface of said semiconductor body for incoming light, a reflection reducing layer completely covering said metallized area and said connection or contact area and a rear face contact on the surface of said semiconductor body opposite said surface of said semiconductor body carrying said metallized area.

Further according to this aspect of the invention, there is provided a solar cell comprising a semiconductor body containing a pn-junction, a metallized area on the upper surface provided for incoming light which is also provided with a reflection reducing layer and a rear face contact on the opposite surface of the semiconductor body, characterized in that the reflection reducing layer completely covers the metallized area including the contact or connection area provided for the purpose of further connection to other cells.

According to a second aspect of the invention, there is provided a battery of solar cells comprising a plurality of solar cells each comprising a semiconductor body, a p-n junction in said semiconductor body, a metallized area on the surface of said semiconductor body for incoming light, a connection or contact area for connection to other cells on said surface of said semiconductor body for incoming light, a reflection reducing layer completely covering said metallized area and said connection or contact area and a rear face contact on the surface of said semiconductor body opposite said surface of said semiconductor body carrying said metallized area and a metallic connector for connecting said connection or contact area of one cell to said rear face contact of a following cell and being fixed to said connection or contact area with said reflection reducing layer eliminated in the area of contact.

BRIEF DESCRIPTION OF THE DRAWINGS

The invention will now be described in greater detail, by way of example, with reference to the drawings, in which.

DESCRIPTION OF THE PREFERRED EMBODIMENTS

Basically, the invention proposes to provide a solar cell comprising a semiconductor body with a p-n junction a metallized area on the light receiving surface, a contact or connection area for connection to other cells and a rear face contact, wherein a reflection reducing layer is provided, completely covering the metallized area and the contact or connection area.

This means that the reflection-reducing layer covers the whole of the front face of the solar cell without gaps. The invention is based on the knowledge that there are contacting methods which make it possible to remove the reflection-reducing layer from the contact region during contacting. The reflection-reducing layer and the method of contacting therefore have to be selected such that this anti-reflection layer is eliminated locally by the surface loading required during contacting. Therefore, it is necessary to ensure that an electrically good and mechanically firm connection between the area of contact and the connection element is achieved by the process of contacting.

The solar cell in accordance with the invention has the advantage that a masking step may be saved during the manufacture of the anti-reflection layer. Moreover, the region of the front face contact provided for the contacting process is covered by a protective and passivating oxide layer until the battery of solar cells are constructed, this oxide layer being removed during contacting only in the immediate vicinity of one or more connection areas.

The reflection-reducing layer in the solar cells may comprise titanium oxide or a titanium oxide mixture, silicon monoxide, silicon dioxide, tantalum oxide, niobium oxide or aluminum oxide. It is also possible for the anti-reflection layer to contain several of these components or be constructed as a whole in several layers. A titanium oxide layer may have a thickness of 65 nm for example. The semiconductor disc or wafer for the solar cell itself may comprise p- or n-conductive, monocrystalline or non-monocrystalline silicon. For example, the use of non-monocrystalline silicon is also possible and this non-monocrystalline silicon is obtainable under the name silso material.

The reflection-reducing layer may be produced thermally, vapour-deposited, centrifugally applied, sprayed on or manufactured by dipping.

The ultrasonic welding process is preferably used to construct batteries of solar cells using the solar cells as above described. Special connection elements are connected to the metal contact arranged on the semiconductor body, with the aid of ultrasonic welding techniques through the reflection-reducing layer which is removed locally. The metal contact of the solar cell comprises aluminium, silver, nickel, or copper, for example, or a layer combination such as titanium-palladium-silver, for example. The special connection elements designed for construction of the battery of solar cells may comprise the same materials.

Figure 1:
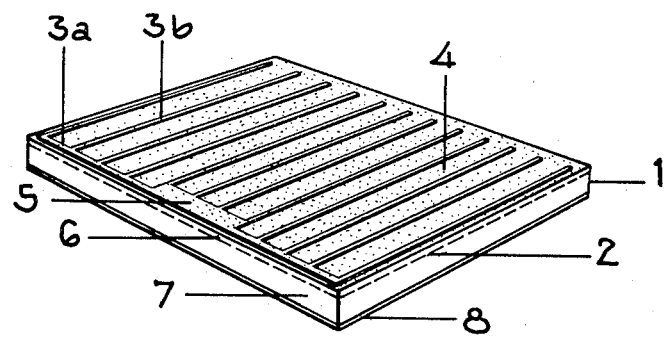
FIG. 1 is a perspective view of a first embodiment of solar cell in accordance with the invention.

Referring now to the drawings in FIG. 1, an individual solar cell 1 is shown which comprises monocrystalline silicon, for example. The base member 7 is p-conductive and has a thin n-conductive surface layer 6. The two regions 6 and 7 form the pn-junction 2 which is parallel to the surface of the semiconductor at the junction area.

The front face of the solar cell provided for incidence of light is provided with a comb-like contact. The narrow and parallel conductors paths 3b terminate at a bus bar 3a which is perpendicular to the strips 3b near the edge of the semiconductor body. This bus bar 3a is broadened in its center region in order to form a contact area 5. The surface region of the solar cell surrounding the area of contact 5 cannot be covered by a reflection-reducing layer in conventional solar cells. In the solar cell in accordance with the invention, however, the entire front face of the solar cell, including the contact area 5, is covered by a reflection-reducing layer 4. This reflection-reducing layer 4 may comprise titanium oxide for example or an oxide of a titanium mixture. The parts 3a, 3b and 5 of the front face contact may comprise aluminium or titanium-palladium-silver. The rear face contact 8 of the solar cells, which preferably covers the entire rear face of the semiconductor body, preferably comprises the same materials as the front face contact.

Figure 2:
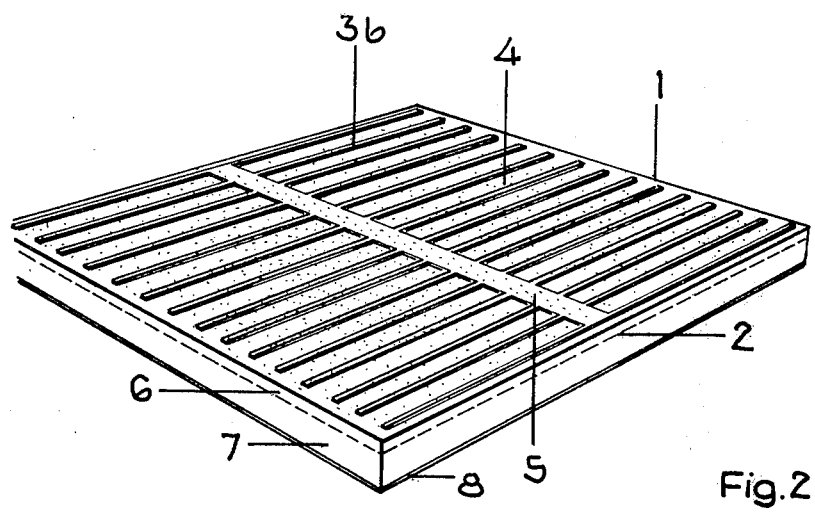
FIG. 2 is a perspective view of a second embodiment of solar cell in accordance with the invention.

In FIG. 2, a solar cell 1 is shown, the front face contact of which has the structure of a double comb. This solar cell comprises for example a non-monocrystalline silicon which may be of material which can be obtained commercially under the name Silso material. This cell is large as compared to the cells manufactured from monocrystalline material and has an edge length of 10 cm for example. Otherwise, the construction of the solar cell according to FIG. 2 corresponds to that of FIG. 1. The cell also contains a pn-junction 2 which separates an n-region 6 from the p-conductive substrate material 7. The front face contact comprises a shaped member 5 which is a few millimeters wide and runs in parallel to the edge of the solar cells at the center of the front face of the solar cells. Narrow and parallel conducting paths 3b go in both directions from this central strip and are evenly distributed over the surface and thus ensure optimum flow of current. In the solar cell according to FIG. 2 too, the whole of the front face of the solar cells including the contact parts 3b and 5 are covered with the reflection-reducing layer 4 which comprises titanium oxide by way of example.

Figure 3:
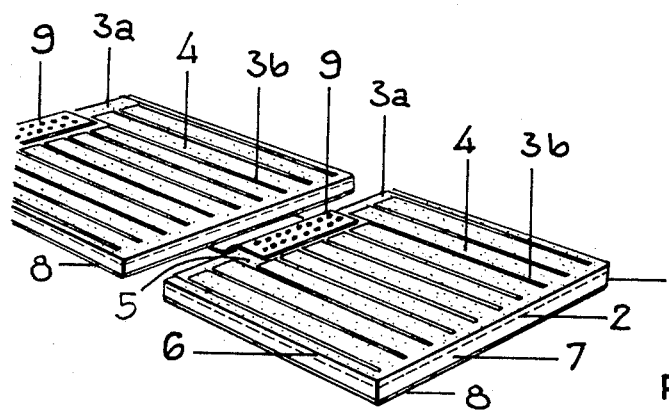
FIG. 3 is a perspective view showing how two cells according to FIG. 1 are connected.

In FIG. 3, two solar cells in accordance with FIG. 1 connected one after the other are shown as part of a battery of solar cells. The front face contact 5 of a first solar cell is connected via a connecting element 9 to the rear face contact 8 of a second solar cell. This connecting element comprises an approximately 50 $\mu$m thick metal strip made of aluminum or silver, for example. The strip is approximately 2 to 5 mm wide. It is fixed to the front face contact 5 or the rear face contact 8 by means of ultrasonic welding. A sonotrode having for example a diameter of ½ mm is used in the ultrasonic welding process and has an effect on the area of connection with a pressure of 1 to 2 kp. Thus the reflection-reducing layer 4 is eliminated over the contact area 5 and an electrically good and mechanically firm connection is produced. During ultrasonic welding, i.e. friction welding, a resonant frequency of 30 kHz is selected by way of example. The overall action time is approximately 200 ms.

Figure 4:
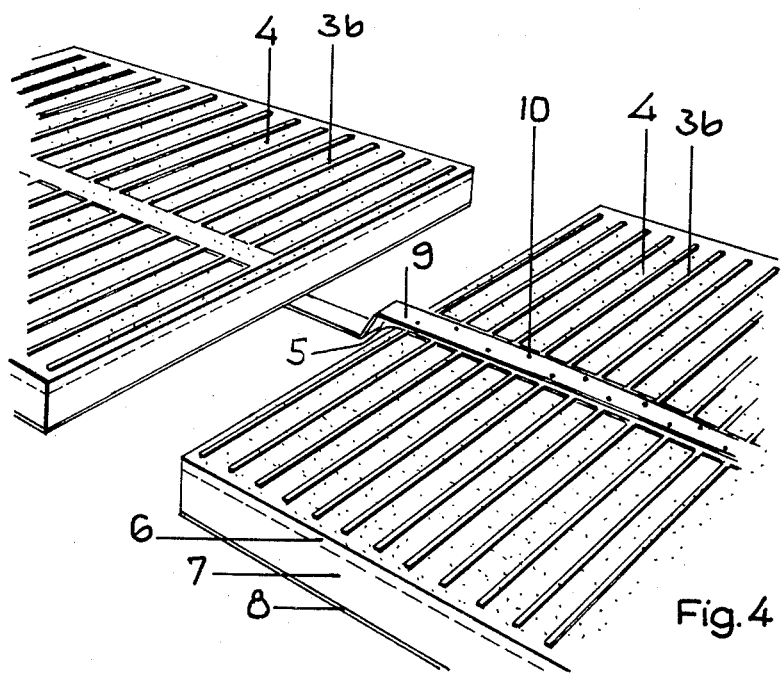
FIG. 4 is a perspective view showing how two cells according to FIG. 2 are connected.

A portion of a battery of solar cells is shown in FIG. 4 which is constructed with cells in accordance with FIG. 2. Here, elongate strip-like connectors 9 are used which comprise aluminum or silver for example. The end of this connection element 9 covers the whole of the bar-shaped part 5 of the front face contact in order to improve the flow of current and is connected to this part 5 through the reflection-reducing layer 4 at numerous weld areas 10 produced by means of ultrasonic welding. The other end of the strip-like connector 9 is welded to the rear face contact 8 of the following solar cell.

It has been mentioned that the reflection-reducing layer 4 may be centrifugally applied on to the solar cells too. In order to achieve this, a silica solution is used, for example which comprises tetraethoxysilane, methanol and 0.1 molar mitric acid. This solution is applied to the rotating solar cell and is distributed evenly thereon. After vaporizing off the volatile components of this solution, a thin layer of silicon dioxide remains on the surface of the semiconductor disc or wafer which is preferably solidified by a tempering process at 600° and 700° C. for approximately 15 min.

It will be understood that the above description of the present invention is susceptible to various modification changes and adaptations.

What is claimed is:

1. In a method for fabricating a solar cell composed of a semiconductor body containing a pn-junction and presenting opposed surfaces, one of which surfaces is a front surface provided with a metallized area including a front connection region and arranged to be exposed to incident light, and the other of which surfaces is a rear surface presenting a rear connection region, which method includes providing a reflection reducing layer on the front surface to completely cover the metallized area including the entirety of the front connection region, the improvement comprising fixing a metal connector to the front connection region by placing the connector against the reflection reducing layer and conductively connecting the connector to the first connection region while concurrently eliminating the reflection reducing layer from that region.

2. A method as defined in claim 1 wherein said step of conductively connecting comprises ultrasonically welding the connector to the first connection region.

3. A method as defined in claim 1 or 2 further comprising applying the connector to a connection region of a further solar cell to form a battery of solar cells.

4. A method as defined in claim 1 or 2 wherein the metal connector is in the form of a strip presenting a plurality of connection areas, and said step of connecting comprises connecting each connecting area to a respective location of the first connection region.

5. A method for producing a battery of solar cells comprising fabricating a plurality of solar cells each by the method defined in claim 1 and attaching the metal connector of each solar cell to the rear connection region of a respective adjacent solar cell.

6. A method as defined in claims 1 or 2, wherein said reflection reducing layer covers the entire front surface of said solar cell without any gaps.

7. A method as defined in claims 1 or 2 wherein said semiconductor body comprises a substrate of a p- or n-conductive monocrystalline silicon.

8. A method as defined in claims 1 or 2 wherein said semiconductor body comprises a substrate of a p- or n-conductive non-monocrystalline silicon.

9. A method as defined in claims 1 or 2, wherein said reflection reducing layer comprises one or more of the group consisting of titanium oxide, silicon monoxide, silicon dioxide, tantalum oxide, niobium oxide, aluminum oxide in one or more layers.

10. A method as defined in claims 1 or 2, wherein said reflection reducing layer is produced thermally, vapourdeposited, centrifugally applied, sprayed on or applied by dipping.

11. A method as defined in claims 1 or 2, wherein said metallized area beneath said reflection reducing layer has a comb structure or a double comb structure and comprises a metal selected from the group consisting of aluminum, silver, nickel or copper.

* * * * *